(12) United States Patent
Stern et al.

(10) Patent No.: US 6,774,694 B1
(45) Date of Patent: Aug. 10, 2004

(54) TIMING VERNIER ARCHITECTURE FOR GENERATING HIGH SPEED, HIGH ACCURACY TIMING EDGES

(75) Inventors: Kenneth J. Stern, Watertown, MA (US); Jeff W. Barrell, Newton, MA (US); Paul S. Cheung, North Andover, MA (US); Thomas Alan Gaiser, Amherst, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/328,637

(22) Filed: Dec. 24, 2002

Related U.S. Application Data (60) Provisional application No. 60/343,956, filed on Dec. 26, 2001.

(51) Int. Cl.[7] .............................................. H03H 11/26
(52) U.S. Cl. ......................... 327/276; 327/284; 327/294
(58) Field of Search ......................... 327/261, 269–271, 327/276, 284, 291, 298, 299, 293–294

(56) References Cited

U.S. PATENT DOCUMENTS

| | | | |
|---|---|---|---|
| 5,280,195 A | * | 1/1994 | Goto et al. ................. 327/294 |
| 5,598,364 A | | 1/1997 | McCall et al. ................. 365/73 |
| 5,854,797 A | | 12/1998 | Schwartz et al. ............ 714/724 |
| 5,861,769 A | | 1/1999 | Black .......................... 327/264 |
| 6,020,773 A | * | 2/2000 | Kan et al. .................... 327/271 |
| 6,073,259 A | | 6/2000 | Sartschev et al. ........... 714/724 |
| 6,100,735 A | * | 8/2000 | Lu .............................. 327/158 |
| 6,580,304 B1 | * | 6/2003 | Rieven ........................ 327/276 |

* cited by examiner

Primary Examiner—Minh Nguyen
(74) Attorney, Agent, or Firm—Koppel, Jacobs, Patrick & Heybl (57) ABSTRACT

A timing vernier applies a pair of stable bias voltages to intermediate points of an impedance string to establish reliable and calibratable delay cell biases for a fine multiplexer. A coarse input multiplexer is switched to a new timing signal substantially immediately after passing a prior valid timing signal to maximize the time prior to each valid output that the waveform is independent of the prior delay pattern. Logic circuitry is provided for three different phase differential regimes between successive timing signals to ensure that invalid output signals separated by less than a clock period are not produced. Mask commands are inserted into a series of timing control commands to equalize the average rates of writing and reading out the timing control commands with the mask commands skipped at readout.

29 Claims, 7 Drawing Sheets

TIMING VERNIER ARCHITECTURE FOR GENERATING HIGH SPEED, HIGH ACCURACY TIMING EDGES

RELATED APPLICATION

This application claims the benefit of provisional application Ser. No. 60/343,956, filed Dec. 26, 2001.

BACKGROUND OF THE INVENTION

1. Field of the Invention

This invention relates to timing verniers, and more particularly to the generation of high speed, high accuracy timing edges.

2. Description of the Related Art

The automatic test equipment (ATE) industry, among others, requires the generation of high speed pulse edges with controllable delays between successive edges. For a variety of cost and integration reasons, CMOS circuitry is preferred. Timing verniers have been constructed using delay cells with delays sensitive to some bias level, with that level stabilized across processing and environmental variations by the use of a feedback loop, either a delay-lock-loop or a phase-lock-loop, and a time reference, usually the period of an input digital clock. Due to the overhead involved in such systems, it is not practical to provide separate loops to generate more than a few independent bias levels.

The desired delays are determined by a data stream of digital input signals. Timing verniers typically consist of controllable delay cells, delay control circuitry, delay calibration circuitry and functional control circuitry. The demands of fast refire (the ability to generate multiple pulse edges rapidly) and high accuracy are difficult to achieve simultaneously.

SUMMARY OF THE INVENTION

A timing vernier which provides substantially glitchless operation, minimizes the effect of previous timing reference signals on the timing accuracy for the present signal, allows for fast refire, and enables the production of finely tuned timing signals with low mismatch errors is provided. Particular embodiments of the invention employ coarse and fine multiplexers to establish the vernier output, with stable bias levels applied to intermediate points of an impedance string to establish reliable bias levels for delay cells associated with the fine multiplexer. The bias levels can be established by delay-lock-loops that are also employed to establish timing reference signal trains for the coarse multiplexer.

The vernier is permitted to output a new timing reference signal only if that signal lags the preceding output signal by at least one clock period. The coarse multiplexer switches to the next timing reference signal train substantially immediately upon processing a preceding valid signal, thus maximizing the time available for the system to settle before the next timing reference edge. Multiple control regimes are provided for different phase differentials between succeeding timing reference signals, ensuring that invalid outputs are suppressed regardless of the state of the next timing reference at the instant of switching. Look-ahead logic allows the phase comparisons to be made in advance of reading out the timing commands.

A hold off capability is also provided that prevents the production of an output signal when such prevention is desired by the user, and is distinguished from validating mask timing commands inserted to satisfy the minimum phase lag requirement. The look-ahead logic is also used to jump over the validating mask commands in the command data store to keep the average read out rate synchronized with the command write rate.

These and further objects and features of the invention will be apparent to those skilled in the art from the following detailed description, taken together with the accompanying drawings.

DETAILED DESCRIPTION

In one embodiment of the present invention, fast refire from a timing vernier is achieved by combining a coarse delay and a fine delay, both consisting of parallel and mutually out-of-phase timing reference signal paths. The coarse delay is created by multiplexing between numerous phase shifted timing reference signals which are generated by an array structure, and which can be shared among other verniers. A fine delay is created by multiplexing between a number of parallel delay cells having different bias-sensitive delays, all of which operate to delay the output of the coarse delay by different amount. The multiplexing is performed "on the fly", in real-time synchronism with the reading of delay commands, but the bias levels which control the individual fine delays are relatively static.

Glitches which might otherwise result from switching in the coarse delay between different reference phases are suppressed by special logic circuitry that makes use of information about upcoming changes in the selected clock phase. Accuracy in the coarse delay is maintained by maximizing the time, prior to each accurate output timing reference transition that the waveform is independent of the prior delay pattern. The previously selected timing reference signal is used to control the timing of switching to the next timing reference signals. Synchronization between this data stream, which is controlled by the variable timing reference signals from the coarse delay, and the input data stream which is controlled by an unchanging system clock, can be accomplished with the use of a FIFO that has the ability to skip relocations.

In this embodiment, the use of different parallel delay paths in the fine delay requires the generation of a significant number of delay controlling bias signals. The multiple bias levels are derived from an impendence string and a pair of delay-stabilized references, allowing for the generation of a near continuum of bias levels. Two delay-lock-loops (DLLs) can be used to produce a pair of bias levels, each associated with a known delay, that are applied to two intermediate points in the impedance string. The delay of each delay cell can be calibrated in fine increments, to mitigate mismatches between parallel delay paths, by selecting one of multiple calibration taps from the impedance string for each bias tap. Although the delay cell delay is a nonlinear function of bias voltage, the non-linearity can be compensated by an appropriate selection of bias voltages from the impedance string.

Figure 1:
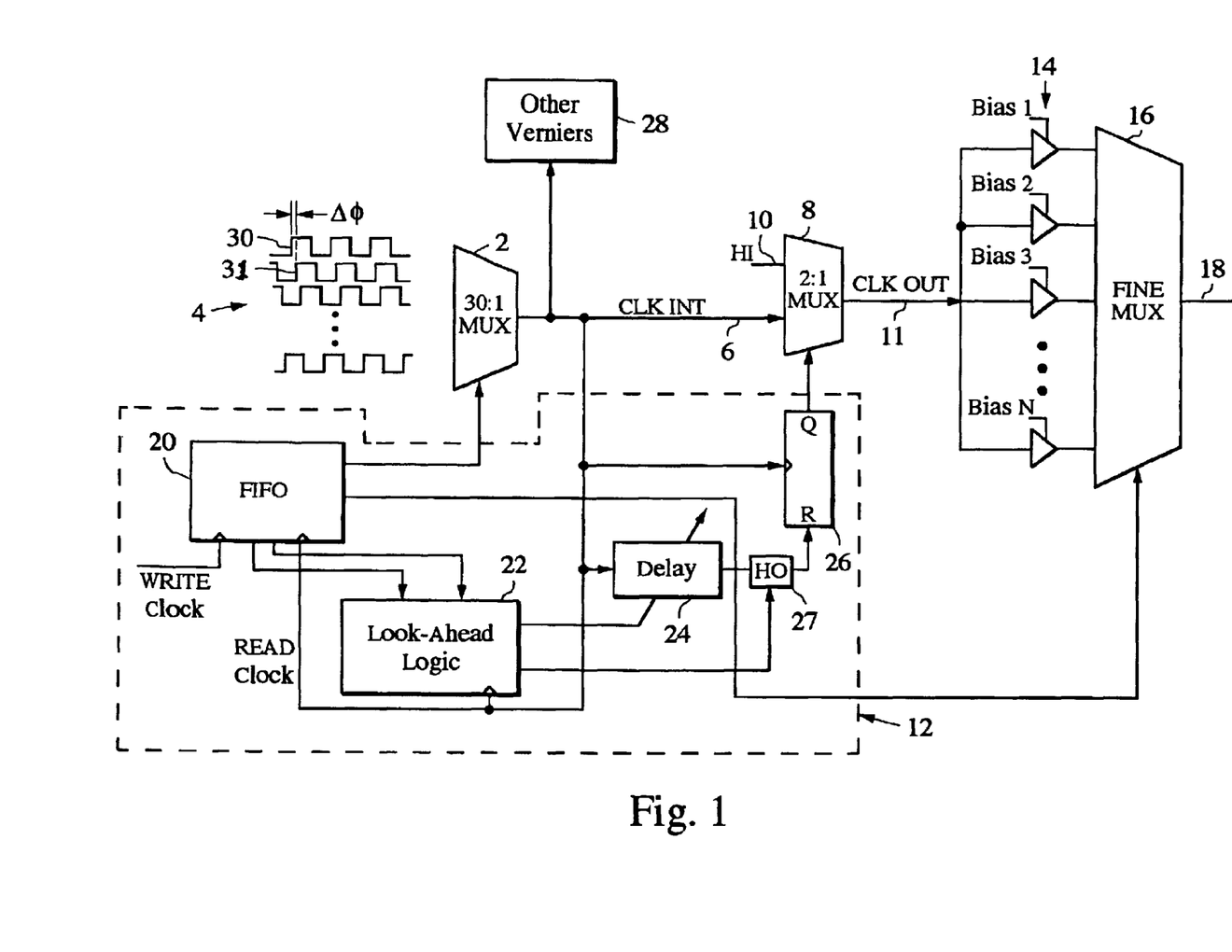
FIG. 1 is a block diagram of a timing vernier in accordance with the invention.

A system capable of implementing this scheme is illustrated in FIG. 1. It includes an input, coarse multiplexer 2 that selects among numerous different and mutually out-of-phase trains of timing reference signals 4 to output a coarse timing reference signal, designated CLK INT (internal clock) on line 6.

The CLK INT signal is delivered to an input of a 2:1 multiplexer 8, which has a second input 10 that is held at a fixed logic level which matches the logic state of the timing reference signals output from the coarse multiplexer 2. In this illustration, the logic level is HI. A control circuit 12 controls the operation of the 2:1 multiplexer 8, as described in further detail below, to set it to its HI input, following the receipt of a CLK INT timing reference signal, for a time sufficient to ensure that the 2:1 multiplexer will pass a new timing reference signal only if it lags the previously passed timing reference signal by at least one clock period. This maximizes the time prior to each allowable timing reference signal that the output from the 2:1 multiplexer is independent of the prior delay pattern. The delay control 12 also ensures that, when 2:1 multiplexer 8 switches from its HI input 10 to the CLK INT signal, the CLK INT is also at a high logic state; this prevents the generation of glitches that might otherwise result from switching between inputs at different logic states.

The coarse delayed timing reference signal at the output line 11 of 2:1 multiplexer 8, designated CLK OUT, is subjected to a fine delay, preferably adjusted to within a few picoseconds, by delivering it to a network of parallel fine delay cells 14 which are biased to introduce fine delays. In one embodiment, the fine delays are in increments on the order of 10 ps. This contrasts with a considerably higher coarse delay between successive timing reference signal trains 4. With a 400 Mhz system clock having a 2.5 nanosecond period, and 30 timing reference signal trains separated by equal phase increments as inputs to the coarse multiplexer, the coarse delay between each successive pair of signal trains would be approximately 83 ps.

A fine multiplexer 16 is operated by control circuit 12 to select among the fine delay cells 14, transmitting the signal from a selected delay cell as the vernier timing reference output on system output line 18.

In the control circuit 12, user supplied timing commands are written into a data store, which is preferably implemented as a FIFO 20, at the system clock rate. Each timing command includes coarse and fine delay data, which are read out from the FIFO and delivered to the coarse and fine multiplexers 2 and 16, respectively. To enable control over the system "on the fly" and ensure proper system operation, the control circuit also includes look-ahead logic 22 that compares the timing control signals in successive stages of FIFO 20 to determine the phase difference between them. The result is used to control a variable delay circuit 24 that resets a set-reset flip-flop (SRFF) circuit 26, the Q output of which controls the switching state of 2:1 multiplexer 8. The CLK INT signal on line 6 is applied as an input to the variable delay 24, and also clocks the operation of FIFO 20, look-ahead logic 22 and flip-flop 26. The operation of the control circuit is explained in detail below in connection with FIGS. 5–9.

The look-ahead logic 22 is shown in the figure as monitoring a pair of FIFO stages prior to the final stage being read out. This provides the time necessary for the logic to operate and downstream elements to respond to the logic prior to the commands being read out from the FIFO. Conceptually, the monitoring of the earlier stage could be done directly at readout, but this would not provide the processing time required in a practical system, unless a pipeline is provided at the FIFO readout port. The look-ahead logic also participates in a mask jump process, described in more detail below, that is used to equalize the average rates of writing data into and reading data out from the FIFO. Even on a conceptual basis, mask jumps require the look-ahead logic to compare FIFO stages prior to the readout stage.

The timing reference signals 4 applied to coarse multiplexer 2 can also be made available to other verniers, illustrated as block 28. The other verniers could be operated in the same manner as illustrated in FIG. 1, or they could have different biases applied to them or even different structures.

The timing reference signal trains 4 are illustrated as trains of alternating logic HI and logic LO pulses. For purposes of this description, a "timing reference signal" refers to the rising edge 30 of a HI pulse, and the phase difference between two successive timing reference signals to the amount by which the phase of one timing reference signal lags the preceding signal. For example, in FIG. 1 the rising edge 31 of a pulse in one signal train lags the rising edge 30 of the preceding signal train by the phase differential $\alpha\phi$.

Figure 2:
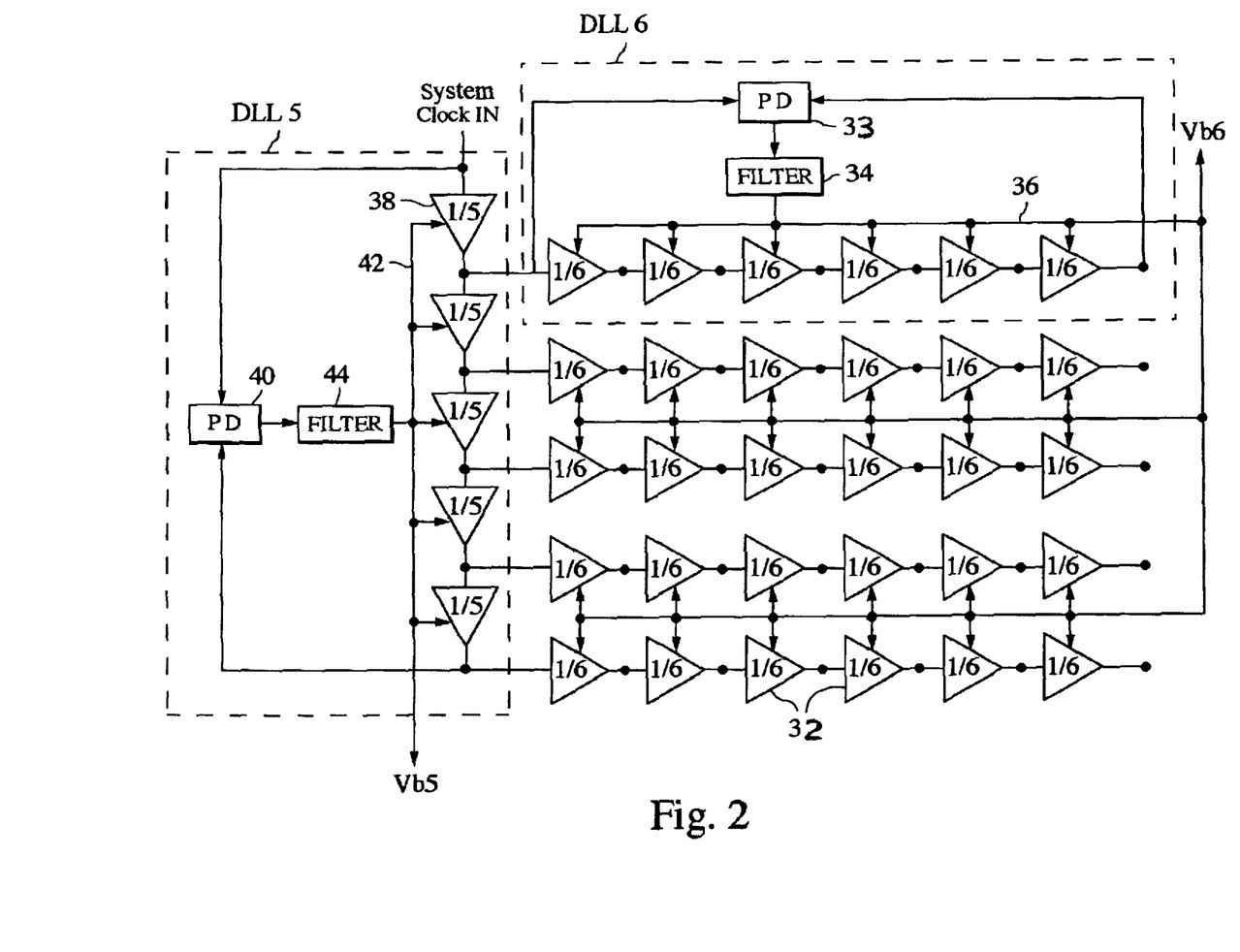
FIG. 2 is a block diagram of a delay array used to generate timing reference signals for the system of FIG. 1.

A known type of delay array that can be used to generate the timing reference signal trains 4 is shown in FIG. 2. It consists of a 5×6 array of delay cells 32, each of which is biased to produce a delay equal to ⅙ of a clock period. Thus, for a clock period of 2.5 ns, each cell 32 will produce a delay of 416.6 ps. The delay cells of each row are connected in series, and the individual cell outputs provide the timing reference signal trains 4 that are input to the coarse multiplexer 2 of FIG. 1.

The control circuit also includes a "hold off" function that is activated in response to a user-supplied timing command indicating that the user wishes to skip a timing signal. Such a command is recognized by the look-ahead logic 22 and used to activate a hold off switch 27 that prevents flip-flop 26 from resetting, and thus inhibits the production of a new CLK OUT timing reference signal from 2:1 multiplexer 8. The hold off operation is also explained in further detail below.

A known type of delay array that can be used to generate the timing reference signal trains 4 is shown in FIG. 2. It consists of a 5×6 array of delay cells 30, each of which is biased to produce a delay equal to ⅙ of a clock period. Thus, for a clock period of 2.5 ns, each cell 30 will produce a delay of 416.6 ps. The delay cells of each row are connected in series, and the individual cell outputs provide the timing reference signal trains 4 that are input to the coarse multiplexer 2 of FIG. 1.

One of the rows of six delay cells forms part of a delay-lock-loop DLL6 that also includes a phase detector 33, which compares the phase of the input to the first cell in the row to the phase at the output of the last cell, and produces an output that is processed by a loop filter 34 to establish a common bias Vb6 on bias line 36 for all of the cells in the array. Since phase delay of 1/6 clock period is desired for each of the cells, and there are six cells in DLL6, phase detector 33 adjusts the bias applied to all of the cells in the array so that it detects a zero phase differential (equivalent to one clock period) across the row it monitors. A phase-lock-loop (PLL) could also be used to establish the biases for the array cells, in a manner equivalent to DLL6.

Inputs to the array rows are obtained from another delay-lock-loop DLL5, consisting of five delay cells 38 in series, with the output of each successive cell connected as an input to a corresponding successive row of the array. DLL5 biases each of its five cells 38 to have a delay equal to 1/5 clock period by means of a phase detector 40 that compares the phases at the input and output of the first and last cells 38, respectively, and produces a common bias Vb5 on line 42 for each of the cells in the loop through a loop filter 44. Thus, a system clock signal at the input to the first cell 38 in DLL5 will undergo a 1/5 clock period delay through each successive cell in that delay loop, thereby providing inputs to the five cell rows in the array with successive phase differences of 1/5 clock period. The combination of 1/5 period delays in DLL5 and 1/6 period delays in DLL6 results in timing reference signal trains at the outputs of each of the cells 32 in the array having successive 1/30 period phase delays. Thus, for a 2.5 ns clock, timing reference signal trains with successive phase delays of nominally 83.33 ps can be obtained.

Figure 3:
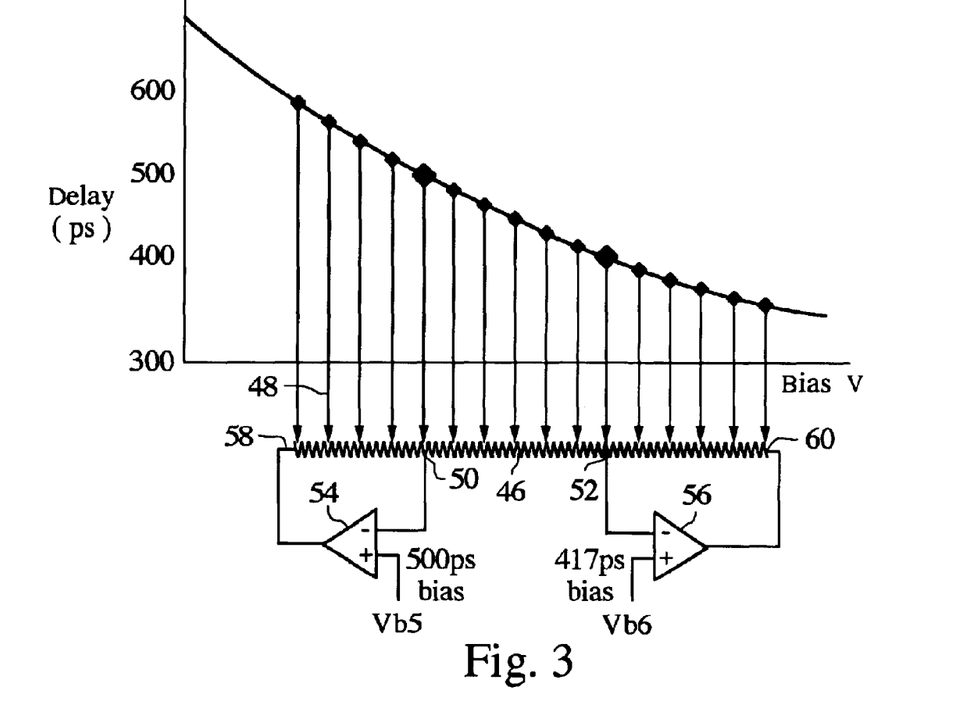
FIG. 3 is a combined graph and schematic diagram of a circuit that can be used to generate bias levels for a fine timing control employed in the system of FIG. 1.

In addition to establishing delays for the timing reference signal trains applied to coarse multiplexer 2, the bias signals Vb5 and Vb6 established on bias lines 42 and 36 by DLL5 and DLL6, respectively, are used in establishing biases for the delays cells 14 at the input to fine multiplexer 16. This arrangement is illustrated in FIG. 3, in which the fine multiplexer delay cell biases are obtained from an impedance string 46, preferably a resistor string, with a voltage applied across the string based upon Vb5 and Vb6.

Multiple bias lines 48 tap bias voltages from the resistor string 46 at distributed locations along its length. These bias taps supply the bias levels for respective delay cells 14 at the input of fine multiplexer 16. As indicated in the figure, the relationship between bias voltage and the resulting cell delay is non-linear and inverse. In this illustration, the bias taps 48 are equally spaced along the resistor string, resulting in a non-linear sequence of cell delays. If linear delay increments are desired, the bias taps could be spaced at unequal increments along the string to compensate for the non-linearity of the voltage-delay curve.

The bias voltages Vb5 and Vb6 are preferably applied to intermediate points 50 and 52 along the resistor string through positive gain amplifiers, illustrated as operational amplifiers (op amps) 54 and 56. Applying the bias voltages to intermediate points, rather than to the ends of the resistance string, allows for a wider range of voltages along the string, while the voltages at all points along the string are still regulated by including them in feedback circuits for op amps 54 and 56. Specifically, the inverting input of op amp 54 is connected to intermediate string point 50, its output is connected to the adjacent end 58 of the string, and its non-inverting input is biased by Vb5, while the inverting input of op amp 56 is connected to intermediate point 52, its output is connected to the opposite end 60 of the string, and its non-inverting input is bias by Vb6. The two op amps are thus connected in opposition to each other, with blended feedback circuits. Since the op amps operate to set the voltages at their inverting inputs equal to the voltages established for their non-inverting inputs, the voltage differential across the intermediate string points 50 and 52 corresponds to a desired multiple of the clock period, (1/30 in this illustration) which in turn corresponds to the phase differential between successive timing reference signal chains 4.

Figure 4:
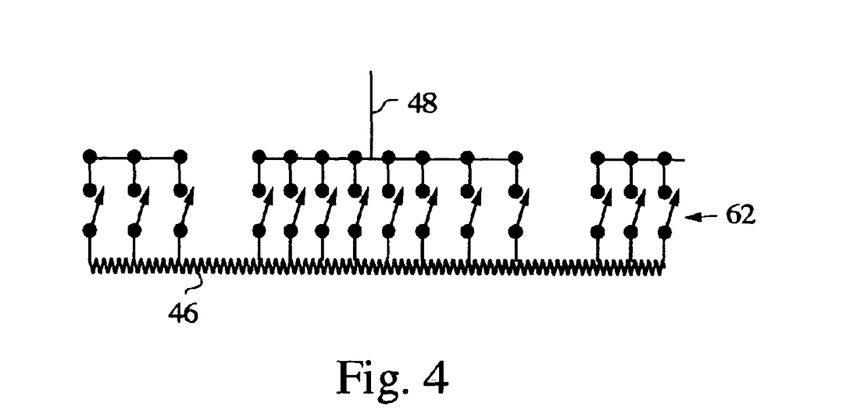
FIG. 4 is a schematic diagram of a calibration structure for the bias circuit of FIG. 3.

To provide a calibration capability for the delay cell biases, each bias tap 48 can be connected to the resistor string 46 through a network of calibration taps 62, as illustrated in FIG. 4. The calibration taps for a given bias tap are distributed along a respective section of the resistor string, and include parallel switches, or alternatively, a switch tree, which connect to the bias tap. The system is calibrated by closing the calibration switch for each bias tap that produces a delay in the bias tap's associated delay cell which most closely approximates the desired delay.

Returning now to the operation of the control circuit 12 of FIG. 1, it is desired that the final vernier output on line 18 be both free of glitches and have propagation delays independent of previous timing reference signals. The CLK INT output of the coarse multiplexer 2 can be considered to be an internal clock selected from the timing reference signal trains 4. Since any selected clock phase can be immediately followed by any other selected clock phase, CLK INT cannot be prevented from having long and short pulses at the times when the phase selection is changed. These must be suppressed to meet the first criterion of glitch free operation. In addition, switching should be done as soon as possible to allow a maximum settling time for all downstream components, to meet the second criterion of history-independent operation.

Control circuit 12 is configured so that only timing reference signals (rising pulse edges of the signal chains 4) which lag the immediately preceding timing reference signal outputted from the vernier by at least a predetermined multiple of the system clock period, preferably unity, are allowed to pass through the 2:1 output multiplexer 8. A timing reference signal which satisfies this criterion is referred to herein as "valid". The system is configured such that a valid timing reference signal on CLK INT propagates through the output multiplexer 8 and immediately causes that multiplexer's selection control to change states and select the HI input 10. The CLK INT signal thus creates a HI at the output of multiplexer 8, and then causes that multiplexer to switch to a HI from the CLK INT path, described below. Multiplexer 8 is only switched back during the HI that immediately precedes the next valid timing reference signal (rising edge) on CLK INT.

Since output multiplexer 8 only switches the source of its output when both of its inputs are HI, its output exhibits at most minor glitches. If a series of clock cycles goes by without the user wanting an output pulse, the pulse suppression is accomplished by holding multiplexer 8 in the HI selection state. The multiplexer selection in effect can be viewed as a function of the one-shot flip-flop 26, which is triggered by a valid rising edge on CLK INT, and whose duration is a function of the number of clock edges to be skipped, as well as of the relative positions of the clock phases before and after the phase selection changes.

The delay 24 is used to hold the output multiplexer 8 at HI for a time between desired edges that is necessary to prevent the system from responding to an invalid edge. The system will create a LO of approximately 1/2 cycle duration preceding each desired LO-to-HI transition. Furthermore, the HI that precedes that LO will be at least 1/2 cycle in duration. Therefore, to the first order, the output of multiplexer 8 and all other downstream elements, going back a full clock cycle preceding any valid rising edge, will be independent of previous timing commands.

The CLK INT signal is also used to clock new controlled data from the FIFO 20 into the input multiplexer 2. This maximizes the settling time available to both multiplexers 2 and 8 before a valid edge is required.

Figure 5:
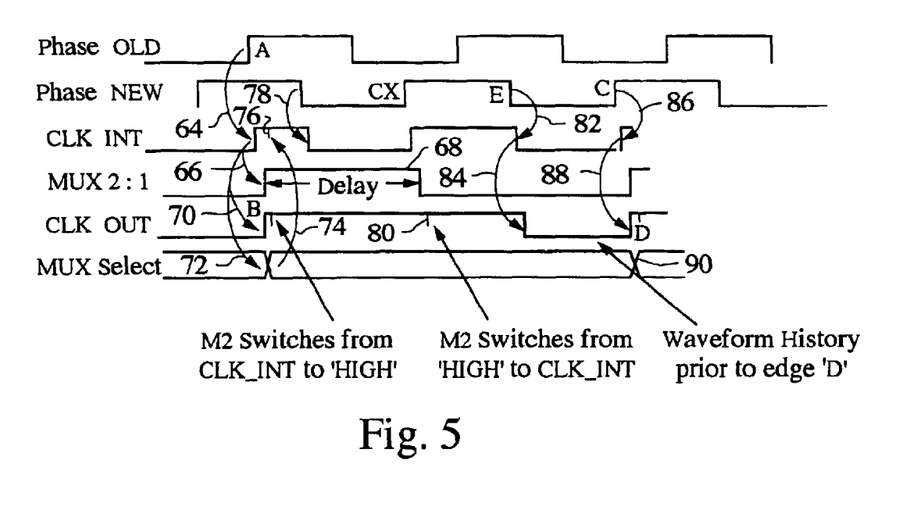
FIG. 5 is a timing diagram representing the minimum phase differential regime achieved with the circuit of FIG. 1.

The switching sequence is illustrated in FIG. 5 for a particular range of phase differentials between successive timing reference signal trains. Phase OLD is the clock phase which is selected initially, while Phase NEW is the clock phase to be selected next. "A" represents the accurate timing reference signal edge that will result in a corresponding CLK OUT edge B. The next valid timing edge C of Phase NEW, following valid timing edge A of Phase OLD, results in the output edge D at CLK OUT. The intervening rising edge CX of Phase NEW is not valid because, unlike edge C, it lags edge A by less than a full clock period. Accordingly, it is not permitted to produce a CLK OUT signal.

When edge A is first processed through multiplexer 2, it causes CLK INT to go HI (arrow 64). This in turn triggers flip-flop 26 to set multiplexer 8 to its HI input (arrow 66), and also initiates a delay pulse by delay circuit 24 that prevents the flip-flop from resetting for a delay period 68. The result is a HI CLK OUT signal from output multiplexer 8 (arrow 70). Finally, the HI on CLK INT causes the data last read from FIFO 20 to switch the input multiplexer 2 from the Phase OLD to the Phase NEW timing reference signal chain (arrows 72 and 74). Since Phase NEW is at a logic HI when the switching occurs (hash mark 76), CLK INT remains HI.

Phase NEW then goes LO, setting CLK INT LO also (arrow 78). However, CLK OUT remains HI because output multiplexer 8 is still set to its HI input 10.

Input multiplexer 2 switches to Phase NEW substantially immediately after CLK INT goes HI. As used herein, the term "substantially immediately" is not intended in an absolute sense, but instead takes into account normal signal propagation and settling times, etc.

The delay provided by delay circuit 24 extends for significantly longer than ½ clock period, but less than a full clock period. Thus, when invalid rising edge CX appears, output multiplexer 8 is still set to its HI input 10, and does not pass this rising edge. The delay pulse then terminates, causing output multiplexer 8 to switch from its HI fixed input to CLK INT (hash mark 80). CLK OUT remains HI because Phase NEW is HI at this time. The situation remains stable until the next falling edge E of Phase NEW, which sets CLK INT LO (arrow 82), in turn setting CLK OUT LO (arrow 84). Finally, valid rising edge C of Phase NEW appears, setting CLK INT HI (arrow 86) to produce a rising output edge on CLK OUT (arrow 88). This initiates the next timing cycle, with input multiplexer 2 switched to the next timing reference signal (90).

The timing reference signal history seen by CLK OUT immediately prior to output edge D is indicated in bold line, and goes back only to the termination of the delay pulse 68, immediately prior to which CLK OUT was set by the HI input 10 to output multiplexer 8. Accordingly, output edge D is virtually independent of the timing of the previous output edge.

The duration of the delay pulse 68 is not critical, but must satisfy two criteria. First, it must be such that the output multiplexer 8 switches back to CLK INT during a HI on CLK INT. Second, it must cause that transition early enough that the propagation delay through the output multiplexer 8 of falling edge E is not dependent upon the transition time of the multiplexer select.

These criteria are met in practice by the use of combinatorial logic such that CLK INT is used as a gate to allow the effective reset signal to occur only when it is HI. However, depending upon the separation of phases between NEW and OLD, CLK INT may be HI at times when it is inappropriate to switch the output multiplexer control. A lockout scheme envisioned by the invention separates the possible phase transitions into three different regimes and selects a different reset path for each regime, depending upon the magnitude of the phase difference. The selection between these reset paths is accomplished by means of control signals that are derived by applying a full binary subtraction between the control data for OLD and NEW. To have the results available in time to set the appropriate reset path, this arithmetic is performed earlier in the data pipeline in the look-ahead logic 22 of FIG. 1.

Figure 6:
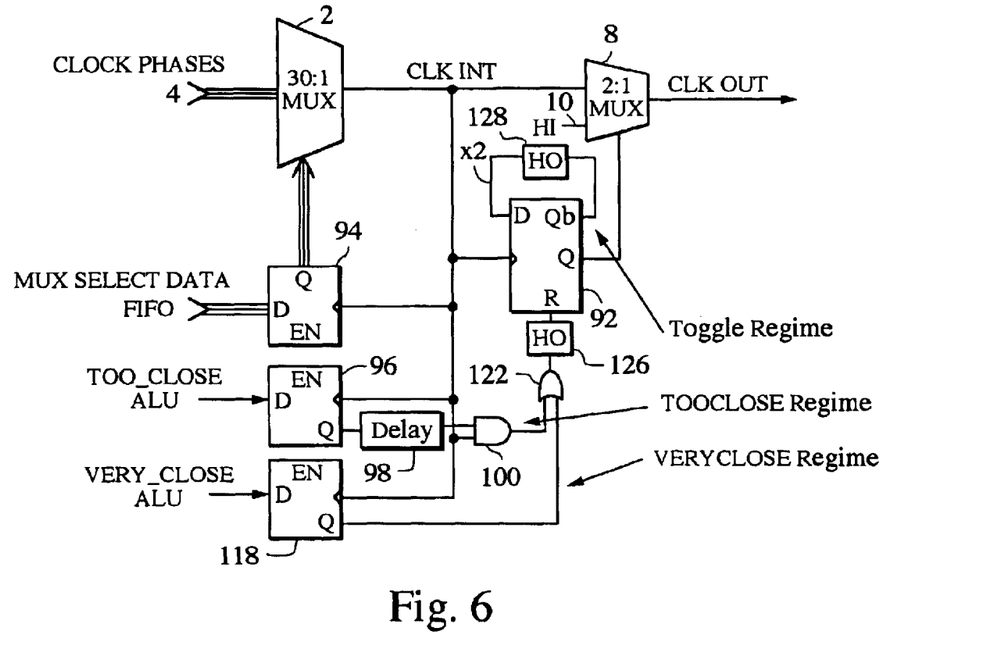
FIG. 6 is a block diagram of an alternate control circuit for the system of FIG. 1.

A control circuit to implement this scheme is shown in FIG. 6. Instead of the SRFF 26 of FIG. 1, a D flip-flop (DFF) 92 is employed. The user-supplied input multiplexer select data is provided to multiplexer 2 through a latch 94 that is gated by CLK INT, as is the DFF 92.

The first regime, referred to as TOGGLE, is used when Phase NEW significantly lags behind Phase OLD. This is the situation illustrated in FIG. 5, in which rising edge CX of Phase NEW lags behind edge A of Phase OLD by more than a half clock period. Edge CX is used to toggle the DFF 92, and the operation is substantially similar to that for the SRFF 26 of FIG. 1.

As the phase lag between Phase NEW and Phase OLD decreases (Phase NEW moves to the left in FIG. 5), eventually Phase NEW will be LO at the time input multiplexer 2 switches to it, the HI on CLK INT will have become increasingly short until its duration is dependent only upon the time required to propagate new data into the input multiplexer control, and the duration of the LO on CLK INT following its initial HI will shrink. At some point, the DFF 92 will be unable to respond to a clock with this narrow LO. At this point, it is not certain that the TOGGLE regime will work properly and a second regime, designated TOOCLOSE, is invoked. The operation of this regime is illustrated in FIG. 7, and will be described in conjunction with the circuit structure of FIG. 6.

The phase differential between Phase OLD and Phase NEW is determined by an arithmetic logic unit (ALU) associated with the FIFO, and when it enters the TOOCLOSE range a data signal is provided to TOOCLOSE latch 96, which is gated by CLK INT. The TOOCLOSE signal is latched into the lockout circuitry on the rising edge of CLK INT. It is then delayed in delay 98 before being applied to one input of an AND gate 100, the other input to which is from CLK INT. The delay is long enough that the output of input multiplexer 2 has time to switch LO (when switching from Phase OLD to Phase NEW) before the delayed TOOCLOSE signal reaches the AND gate.

Figure 7:
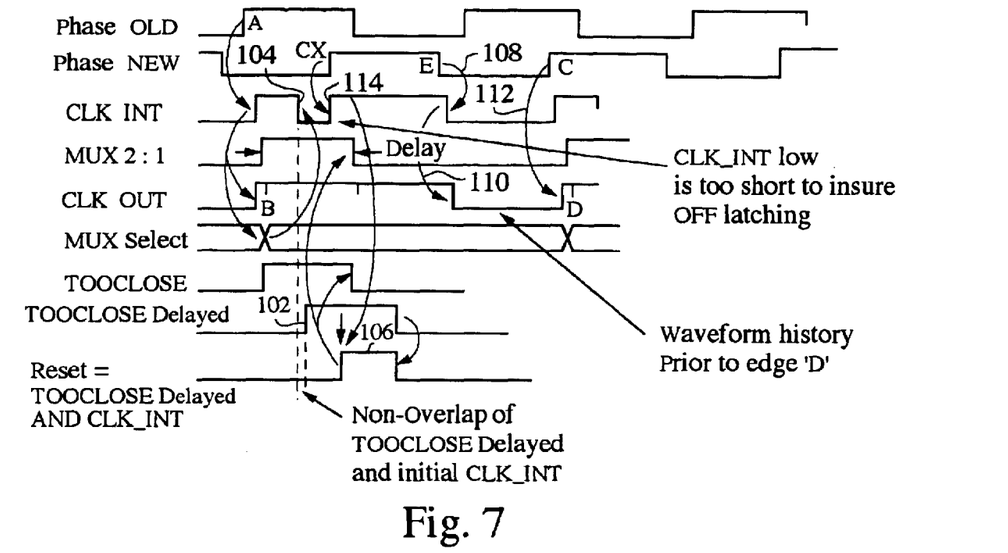
FIGS. 7, 8 and 9 are timing diagrams representing a second phase transition control regime that can be implemented with the control circuit of FIG. 6, a potential problem with the second regime, and a third phase transition regime that solves this problem, respectively.

Referring to FIG. 7, the delay is set such that the delayed production of TOOCLOSE at the output of AND gate 100, indicated by rising edge 102, occurs after the maximum time expected for CLK INT to go LO (falling edge 104) in response to its being switched to Phase NEW. Accordingly, no signal is transmitted through AND gate 100 to reset DFF 92. Sometime later, the invalid rising edge CX of Phase NEW brings CLK INT HI. With both of its inputs now HI, AND gate 100 produces a reset pulse 106 that resets DFF 92 to switch output multiplexer 8 from its constant HI input 10 to CLK INT. Since the latter signal is also HI at this point, switching glitches are avoided and CLK OUT remains HI. Subsequently, Phase NEW goes LO at falling edge E, setting CLK INT LO (arrow 108), which in turn sets CLK OUT LO (arrow 110). CLK OUT is thus enabled to go HI again in response to valid Phase NEW rising edge C (arrow 112).

The delay in TOOCLOSE ensures that the reset does not trigger as a result of the HI pulse on CLK INT that terminates at falling edge 104, but rather after the following rising edge on CLK INT. If this were not the case, it might be possible to toggle the output multiplexer control again, on the rising edge 114 of CLK INT immediately following falling edge 104. The output multiplexer output would then track CLK INT, which is not the desired effect. The timing of the reset pulse is such that, even if the rising edge 114 of CLK INT causes DFF 92 to toggle back to its original state, the reset reinforces the same result. The reset also causes the TOOCLOSE signal to be reset, so that the next leading edge of CLK INT (in response to edge C of Phase NEW), which is a valid edge and is intended to initiate an output edge, does not battle with reset to have its desired effect.

Figure 8:
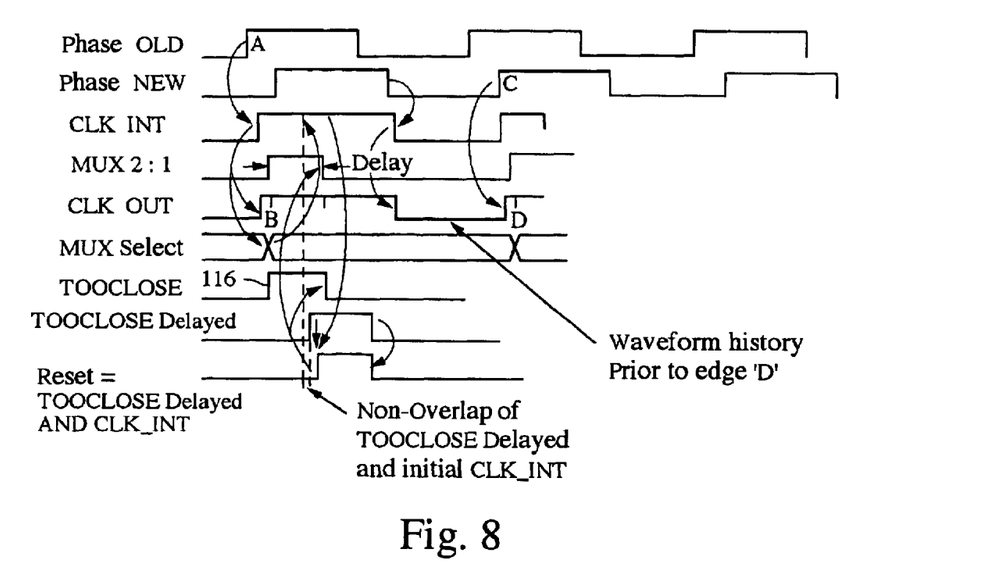

As the phase of Phase NEW becomes continuously closer to Phase OLD, the short duration of the LO on CLK INT disappears altogether. This situation is illustrated in FIG. 8. Ideally, the TOOCLOSE regime will still work here, with the AND gate 100 generating a reset pulse the first time both the delayed TOOCLOSE and CLK INT are HI. This occurs as soon as the delayed TOOCLOSE signal goes HI (edge 116), since CLK INT does not actually go LO. In reality, the time required for the input multiplexer output to be buffered and become CLK INT, to latch the new phase selection data into the input multiplexer, and for that multiplexer to respond, is long enough with some kinds of circuit processing that the delayed version of TOOCLOSE must be delayed further than in FIG. 7. This results in so little time being left in the duration of the HI on CLK INT (in the worse case Phase OLD is equal to Phase NEW) that there is insufficient overlap between CLK INT and delayed TOOCLOSE to produce a reliable reset pulse. A third regime, referred to as VERYCLOSE, is employed to address this situation.

An additional combinatorial logic path creates the reset for those cases when it is possible that the TOOCLOSE path might be delayed too much to provide a reliable reset. VERYCLOSE is invoked only when there is no possibility that the change from the Phase OLD to Phase NEW could result in a LO pulse during what would have been the HI pulse of Phase OLD. The VERYCLOSE signal is delivered into a latch 118 on the rising edge 120 of CLK INT (see FIG. 9). In this regime, the VERYCLOSE signal immediately causes DFF 92 to reset the output multiplexer 8. The delayed output of TOOCLOSE latch 96 and the nondelayed output of VERYCLOSE latch 118 are routed through an OR gate 122 into the DFF 92 reset port. As long as DFF 92 is reset and causes output multiplexer 8 to switch to CLK INT (hash mark 124) before CLK INT goes LO, there will be no effect upon timing accuracy.

Figure 9:
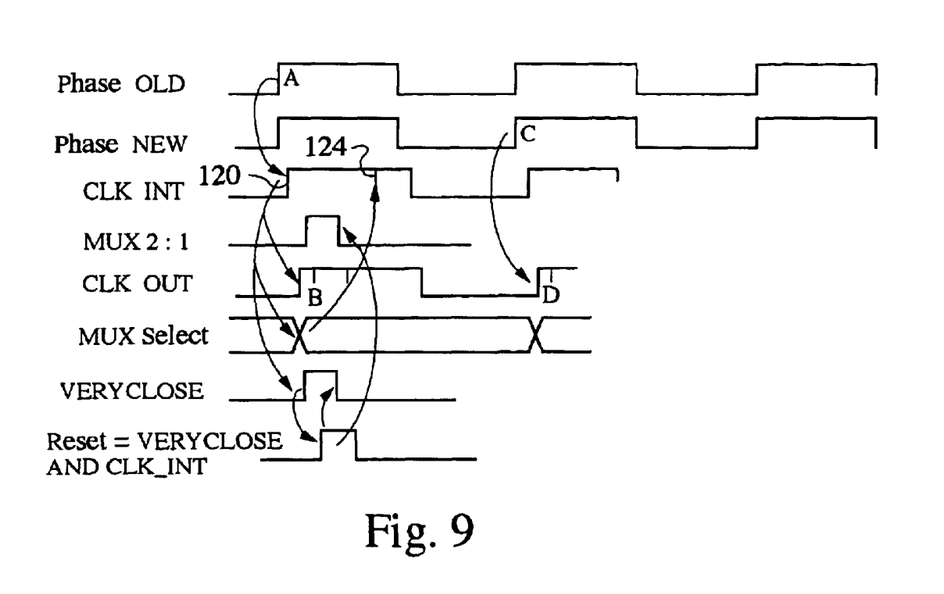

The reset regimes described above suppress any LOs on CLK OUT that would be inconsistent with the minimum legal spacing between rising edges, namely one period of the master clock. In addition, a hold off function is preferably added to suppress the production of an otherwise valid rising edge on CLK OUT by providing hold off switches 126 and 128 at the reset input and toggle loops of DFF 92, respectively. The output multiplexer 8 is prevented from switching to CLK INT to pick up an otherwise valid rising edge by opening the switches during hold off. Hold off is used to override the reset toggle on those cycles for which the user does not wish to produce an output edge. The reset and toggle can be suppressed by combinatorial logic for as many cycles as is desired.

Figure 10:
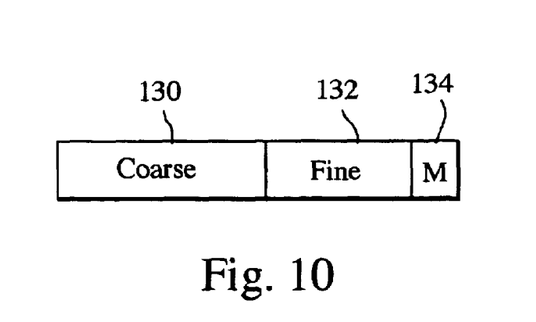
FIG. 10 is an illustration of a digital timing command that can be input to the system.

The structure of a suitable digital timing command for input into FIFO 20, to control the delay of an output pulse relative to a fixed reference, is illustrated in FIG. 10. In one example, Coarse datea 130 consists of 5 bits, controlling a selection of one out of 30 equal delays in the coarse section of the vernier. Each step is nominally 2.5 nano-seconds/30= 83.33 pico-seconds. Fine data 132 consists of 4 bits, and controls the fine delay with 16 settings covering a range of 150 ps. This overlap of coarse and fine ranges allows for correction of coarse linearity error. Because of non-monotonicity and because the coarse does not have a binary span, Coarse and Fine data cannot be considered to be the MSBs and LSBs of a single word.

A single bit 134 of the control word is allocated to a mask (M) function for hold off. A mask signal is inserted for two situations. First, if the user desires to suppress the production of a valid vernier output edge during that clock cycle, a mask bit is inserted and the rest of the timing command remains the same as for the previous clock cycle. Second, even if the suppression of an output edge is not desired for that particular cycle, the user is instructed to insert a mask bit as appropriate to keep the average rates of writing timing commands into the FIFO and reading them out equal.

Figure 11:
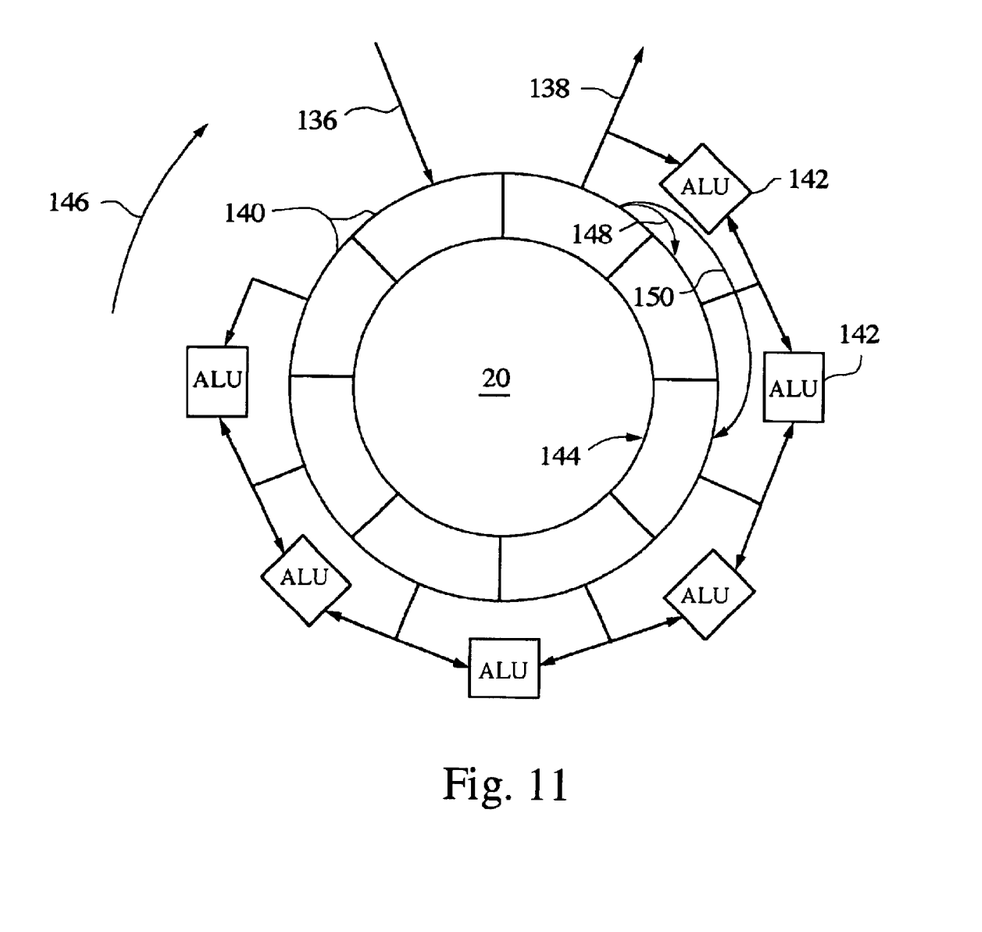
FIG. 11 is a block diagram illustrating the operation of a FIFO that can be used to store a timing command sequence.

The operation of FIFO 20 is illustrated in FIG. 11. An eight stage FIFO is depicted, with data written into one stage (arrow 136) under the control of the WRITE clock, while data is read out from another stage (arrow 138) under the control of CLK INT, for transmission to the coarse multiplexer 2 and fine multiplexer 16. The contents of successive pairs of stages 140 between the readout and write stages are monitored by respective arithmetic logic units (ALUs) 142. A single large ALU that monitors all stages between readout and write could be used instead of separate ALUs for each successive pair of stages, but it would be more complicated. The ALUs perform binary subtractions between the Coarse control data contents of their two monitored stages to determine the phase differential between the timing reference signals which they contain. They thus function as comparators, with the results of the stage comparisons used to determine which lockout regime to employ for any given sequence of control words. The ALU computation is performed several stages prior to the monitored stages being read out to provide the "look-ahead" capability discussed previously.

The operation of the FIFO may be visualized as a stationary ring 144 of FIFO data storage stages, with the write 136, readout 138 and ALU comparisons advancing around the ring in single stage increments for each clock cycle. This "rotation" is indicated by arrow 146. Thus, on a clock cycle following the readout of data from any particular FIFO stage, new data is written into that stage, and is thereafter read out only after readouts have been obtained from all of the intervening stages. This advancement in single-stage increments is indicated by arrow 148.

While conceptually data can be read out of the FIFO on the selected CLK INT clock, in practice CLK INT still has glitches on it and would be unsuitable for clocking other elements. Accordingly, the actual READ CLK preferably used to read the FIFO and operate the pipeline is a version of CLK INT which has been glitch suppressed in a virtually identical manner to the entire operation described for CLK OUT, the only difference being that there is no provision for holdoff.

As described above, the shortest allowed refire time is 2.5 ns, or one period of the master 400 MHz clock. Since the rate at which data is read out of the FIFO varies and, by definition, must be at least equal to 2.5 ns, the rate at which the FIFO is emptied is less than the rate at which it is filled, which is not a sustainable situation. This is the reason for requiring the user to insert a mask in certain timing commands—to keep the average FIFO write and read rates equal. Different mask insertion rules can be established for this purpose, as long as they have the desired equalization effect and are recognizable by the look-ahead logic 22. Equalizing mask commands are inserted to bring the average rate of writing in new coarse and fine multiplexer select commands up to the average rate of reading them out. The equalizing mask commands each add a timing command to the FIFO write, but are skipped when reading out from the FIFO. Each equalizing mask command includes a HI mask bit 134, and repeats the coarse and fine select bits 130 and 132 from the previous command. A rule is established for the insertion of equalizing masks that results in an equalization of average FIFO write and read rates, and also provides a way for the look-ahead logic to distinguish between intentional and equalizing masks. For example, an equalizing mask can be inserted each time the coarse multiplexer timing command is to change from a higher to a lower order signal train in the input array. Thus, when it sees an active mask bit, the look-up logic can compare the coarse timing command in the same comman word with the coarse command for the next command word to determine whether the mask is intentional or equalizing.

A portion of the ALU and associated logic looks for equalizing masks and, when they is found, causes the FIFO readout to jump over the stage containing the mask, as indicated by arrow 150. In this way, the average rate at which data is read from the FIFO is maintained equal to the average rate at which the data is written into the FIFO.

A FIFO location containing an intentional the mask is not skipped. Such a mask is converted to a hold off signal and propagated to the lockout logic to suppress the appropriate output pulse, but not the pulse on the clock used to read the FIFO and operate the data pipelining.

Hold off is always accompanied by the previous data so that the clock which operates the pipeline keeps a proper count. Also, by maintaining the previous data and switching just before an output pulse based on the new data is to be generated, long periods with no output can be readily generated without the need for the user to supply the new data far in advance.

The ALUs perform a 5 bit two's compliment subtraction with sign to determine the difference between two sequential data words. They have additional logic which generate signals indicating the sign of the difference (used for the jump function described above), and signals indicating which lockout regime should be used. Although the use of one ALU for every pair of FIFO read ports is redundant in circuitry, it allows multiple clock periods to complete the arithmetic processing, making the ALU design more simple and reliable. By using read ports on the FIFO several stages ahead of the stage being read out to the multiplexers, the calculations can be performed before the output data is presented, and the FIFO itself serves as the pipeline delay.

While particular embodiments of the invention have been shown and described, numerous alternatives and alternate embodiments will occur to those skilled in the art. Accordingly, it is intended that the invention be limited only in terms of appended claims.

We claim:

1. A timing vernier, comprising:
   a timing reference signal source,
   a plurality of timing reference signal delay cells connected to receive timing reference signals from said source,
   a selector connected to select an output from one of said cells as a vernier output, and
   a bias network connected to apply different biases to said cells to delay said timing reference signals by different amounts, said network comprising:
   an impedance string,
   a delay setting voltage source connected to establish a voltage across said string by applying a voltage differential across intermediate points of said string, and
   a plurality of bias taps which tap different locations of said string to provide biases for respective ones of said delay cells.

2. The timing vernier of claim 1, said selector comprising a multiplexer connected to select among said delay cells under the control of a user supplied control input.

3. The timing vernier of claim 1, wherein said delay setting voltage source comprises a pair of positive gain amplifiers, with the portions of said string between its ends and respective one of said intermediate string points connected in respective feedback loops for said amplifiers.

4. The timing vernier of claim 3, wherein said amplifiers are oriented in opposition to each other.

5. The timing vernier of claim 4, wherein said amplifiers comprise operational amplifiers having their outputs connected to respective ends of said string and their inverting inputs connected to respective ones of said intermediate string points, said delay setting voltage source further comprising a pair of bias sources connected to apply respective biases to the non-inverting inputs of said operational amplifiers corresponding to desired delay biases between said bias taps.

6. The timing vernier of claim 5, wherein said timing reference signal source provides said timing reference signals based upon a system clock, and said bias sources comprise respective delay lock loops (DLLs) with respective loop delay cells, each of said DLLs generating a bias voltage to establish a delay for its delay cells based upon the period of said clock and applying said bias voltage to the non-inverting input of its respective operational amplifier.

7. The timing vernier of claim 6, wherein said DLLs include different respective numbers of loop delay cells, with different respective biases and individual delay cell delays for each of said DLLs, the difference in the delay cell delays between the DLLs corresponding to a desired multiple of said clock period, thereby establishing said voltage differential across said intermediate string points which corresponds to said desired multiple of said clock period.

8. The timing vernier of claim 7, wherein said multiple is less than unity.

9. The timing vernier of claim 1, wherein said timing reference signal source comprises a coarse timing reference signal generator which generates a series of coarse timing reference signals separated by coarse delay periods for said delay cells, and said delay cells provide a fine timing control for said coarse timing reference signals.

10. The timing vernier of claim 9, said coarse timing reference signal generator including a delay cell array and a pair of delay lock loops (DLLs) establishing reference delays for said array, said DLLs also establishing a reference for said delay setting voltage source.

11. The timing vernier of claim 10, said DLLs comprising respective series of reference delay cells and respective phase detectors connected to establish common biases for the delay cells of their DLL that are different from the common bias for the delay cells of the other DLL, wherein said voltage differential applied across said intermediate string points is based upon said common biases.

12. The timing vernier of claim 9, further comprising a system clock which provides a timing reference, said coarse timing reference signal generator including a source of a plurality of mutually out-of-phase timing reference signal trains based upon said clock, an input multiplexer connected to select among said timing reference signal trains, and an output to said fine tuning control, further comprising a control which inhibits the establishment of a timing reference signal on said vernier output less than one clock period after the previous timing reference signal.

13. The timing vernier of claim 12, wherein said control includes an output multiplexer that selects between the output of said input multiplexer and a fixed logic state to establish said inhibit.

14. The timing vernier of claim 13, wherein said control includes a data input for receiving a sequence of timing reference signal train select commands, and causes said input multiplexer to select the subsequent timing reference signal train in said sequence substantially immediately after it has processed a timing reference signal from a selected timing reference signal train in the absence of an inhibit.

15. The timing vernier of claim 14, wherein said control includes a data store for said commands and logic that equalizes the average rates of writing commands into and reading commands out of said data store.

16. The timing vernier of claim 14, wherein said control provides said inhibit by causing said output multiplexer to select said fixed logic state in response to said input multiplexer passing a timing reference signal from a selected timing reference signal train while said inhibit is off.

17. The timing vernier of claim 16, wherein said control terminates said inhibit to allow said output multiplexer to pass a timing reference signal of a selected timing reference signal train only at least one clock period after it has passed a timing reference signal of the preceding timing reference signal train.

18. The timing vernier of claim 17, wherein said control terminates said inhibit only when the logic state of said preceding timing reference signal train matches said fixed logic state.

19. The timing vernier of claim 18, wherein said control includes multiple modes for terminating said inhibit, and selects among said modes based upon the phase lag of said selected timing reference signal train relative to said preceding timing reference signal train.

20. The timing vernier of claim 19, said modes including a first mode, for relatively long phase lags for which it is certain that said inhibit can be terminated in response to the first timing reference signal of a selected timing reference signal train, wherein said inhibit is terminated in response to said first timing reference signal.

21. The timing vernier of claim 20, said modes including a second mode, for shorter phase lags than said first mode for which it is uncertain whether said inhibit can be terminated in response to said first timing reference signal, wherein said control delays the termination of said inhibit until after said first timing reference signal.

22. The timing vernier of claim 21, said modes including a third mode, for very short phase lags for which it is not assured that said inhibit can be terminated by said second mode, wherein said control terminates said inhibit in response to said preceding timing reference signal train.

23. The timing vernier of claim 19, wherein said control includes an override for overriding the termination of said inhibit in response to an override command.

24. The timing vernier of claim 23, said override command comprising the immediately preceding timing reference signal train select command, coupled with a mask command.

25. The timing vernier of claim 24, said data store comprising a FIFO having multiple stages which store respective select commands.

26. The timing vernier of claim 25, said comparator comprising at least one arithmetic logic unit connected to compare successive stages of said FIFO to determine said phase difference.

27. The timing vernier of claim 19, wherein said data input includes a data store that stores and updates multiple commands of said sequence, and said control further includes a comparator connected to compare successive commands in said data store to determine said phase difference.

28. The timing vernier of claim 27, wherein said control causes said comparator to compare successive commands prior to said commands being provided to said input multiplexer, thereby providing time for the results of said comparison to be processed to control said mode selection.

29. The timing vernier of claim 1, further comprising, for each of said bias taps, a respective plurality of calibration taps distributed along respective sections of said impedance string, and respective switches for said calibration taps, said switches being operable to connect their respective bias taps to a selected calibration tap to establish calibrated biases for said delay cells.

* * * * *